(12) United States Patent
Johnson

(10) Patent No.: US 7,724,008 B2
(45) Date of Patent: May 25, 2010

(54) METHODS AND APPARATUS FOR PLANAR EXTENSION OF ELECTRICAL CONDUCTORS BEYOND THE EDGES OF A SUBSTRATE

(75) Inventor: Morgan T. Johnson, Portland, OR (US)

(73) Assignee: Advanced Inquiry Systems, Inc., Hillsboro, OR (US)

( * ) Notice: Subject to any disclaimer, the term of this patent is extended or adjusted under 35 U.S.C. 154(b) by 0 days.

(21) Appl. No.: 12/325,269

(22) Filed: Dec. 1, 2008

(65) Prior Publication Data

US 2009/0189627 A1  Jul. 30, 2009

Related U.S. Application Data

(62) Division of application No. 11/825,567, filed on Jul. 6, 2007, now Pat. No. 7,459,924.

(60) Provisional application No. 60/819,318, filed on Jul. 7, 2006.

(51) Int. Cl.
   *G01R 31/02* (2006.01)
(52) U.S. Cl. ..................... 324/758; 324/754
(58) Field of Classification Search ............ None
   See application file for complete search history.

(56) References Cited

U.S. PATENT DOCUMENTS

| | | | | |
|---|---|---|---|---|
| 7,098,680 B2 * | 8/2006 | Fukushima et al. | ......... | 324/763 |
| 7,456,643 B2 * | 11/2008 | Johnson | ......... | 324/754 |
| 7,459,924 B2 * | 12/2008 | Johnson | ......... | 324/754 |
| 7,489,148 B2 * | 2/2009 | Johnson | ......... | 324/754 |
| 7,570,796 B2 * | 8/2009 | Zafar et al. | ......... | 382/144 |
| 7,578,057 B2 * | 8/2009 | Eslamy et al. | ......... | 29/842 |
| 2008/0248663 A1 * | 10/2008 | Johnson et al. | ......... | 439/152 |
| 2009/0284274 A1 * | 11/2009 | Johnson | ......... | 324/754 |

\* cited by examiner

*Primary Examiner*—Paresh Patel
(74) *Attorney, Agent, or Firm*—Raymond J. Werner

(57) ABSTRACT

Concurrent electrical access to the pads of integrated circuits on a wafer is provided by an edge-extended wafer translator that carries signals from one or more pads on one or more integrated circuits to contact terminals on the inquiry-side of the edge-extended wafer translator, including portions of the inquiry-side that are superjacent the wafer when the wafer and the edge-extended wafer translator are in a removably attached state, and portions of the inquiry side that reside outside a region defined by the intersection of the wafer and the edge-extended wafer translator. In a further aspect of the present invention, access to the pads of integrated circuits on a wafer is additionally provided by contact terminals in a second inquiry area located on the wafer-side of the edge-extended wafer translator in a region thereof bounded by its outer circumference and the circumference of the attached wafer.

7 Claims, 6 Drawing Sheets

METHODS AND APPARATUS FOR PLANAR EXTENSION OF ELECTRICAL CONDUCTORS BEYOND THE EDGES OF A SUBSTRATE

CROSS-REFERENCE TO RELATED APPLICATIONS

This is a divisional application of U.S. non-provisional application Ser. No. 11/825,567, filed 6 Jul. 2007, now U.S. Pat. No. 7,459,924 entitled "Methods And Apparatus For Planar Extension Of Electrical Conductors Beyond The Edges Of A Substrate", which claimed the benefit of provisional application 60/819,318, filed 7 Jul. 2006, entitled "Methods And Apparatus For Planar Extension Of Electrical Conductors Beyond The Edges Of A Substrate", the entirety of each is hereby incorporated by reference.

FIELD OF THE INVENTION

The present invention relates generally to semiconductor test equipment, and more particularly relates to methods and apparatus for routing electrical conductors to and from integrated circuits, microelectromechanical systems (MEMS), or similar structures in a test environment.

BACKGROUND

Advances in semiconductor manufacturing technology have resulted in, among other things, reducing the cost of sophisticated electronics to the extent that integrated circuits have become ubiquitous in the modern environment.

As is well-known, integrated circuits are typically manufactured in batches, and these batches usually contain a plurality of semiconductor wafers within and upon which integrated circuits are formed through a variety of semiconductor manufacturing steps, including, for example, depositing, masking, patterning, implanting, etching, planarizing, and so on.

Completed wafers are tested to determine which die, or integrated circuits, on the wafer are capable of operating according to predetermined specifications. In this way, integrated circuits that cannot perform as desired are not packaged, or otherwise incorporated into finished products.

It is common to manufacture integrated circuits on roughly circular semiconductor substrates, or wafers. Further, it is common to form such integrated circuits so that conductive regions disposed on, or close to, the uppermost layers of the integrated circuits are available to act as terminals for connection to various electrical elements disposed in, or on, the lower layers of those integrated circuits. In testing, these conductive regions are commonly contacted with a probe card.

With respect to probe card technology, the maintenance of probe tip accuracy, good signal integrity, and overall dimensional accuracy severely strains even the best of these highly developed fabrication methods because of the multiple component and assembly error budget entries for such assemblies.

What is needed are lower-cost, less-complex apparatus and methods to increase test efficiency.

SUMMARY OF THE INVENTION

Briefly, concurrent electrical access to the pads of integrated circuits on a wafer is provided by an edge-extended wafer translator that carries signals from one or more pads on one or more integrated circuits to contact terminals on the inquiry-side (i.e., the non-wafer-side) of the edge-extended wafer translator, including portions of the inquiry-side that are superjacent the wafer when the wafer and the edge-extended wafer translator are in a removably attached state, and portions of the inquiry side that reside outside a region defined by the intersection of the wafer and the edge-extended wafer translator.

In a further aspect of the present invention, access to the pads of integrated circuits on a wafer is additionally provided by contact terminals in a second inquiry area located on the wafer-side of the edge-extended wafer translator in a region thereof bounded by its outer circumference and the circumference of the attached wafer.

DETAILED DESCRIPTION

Figure 1:
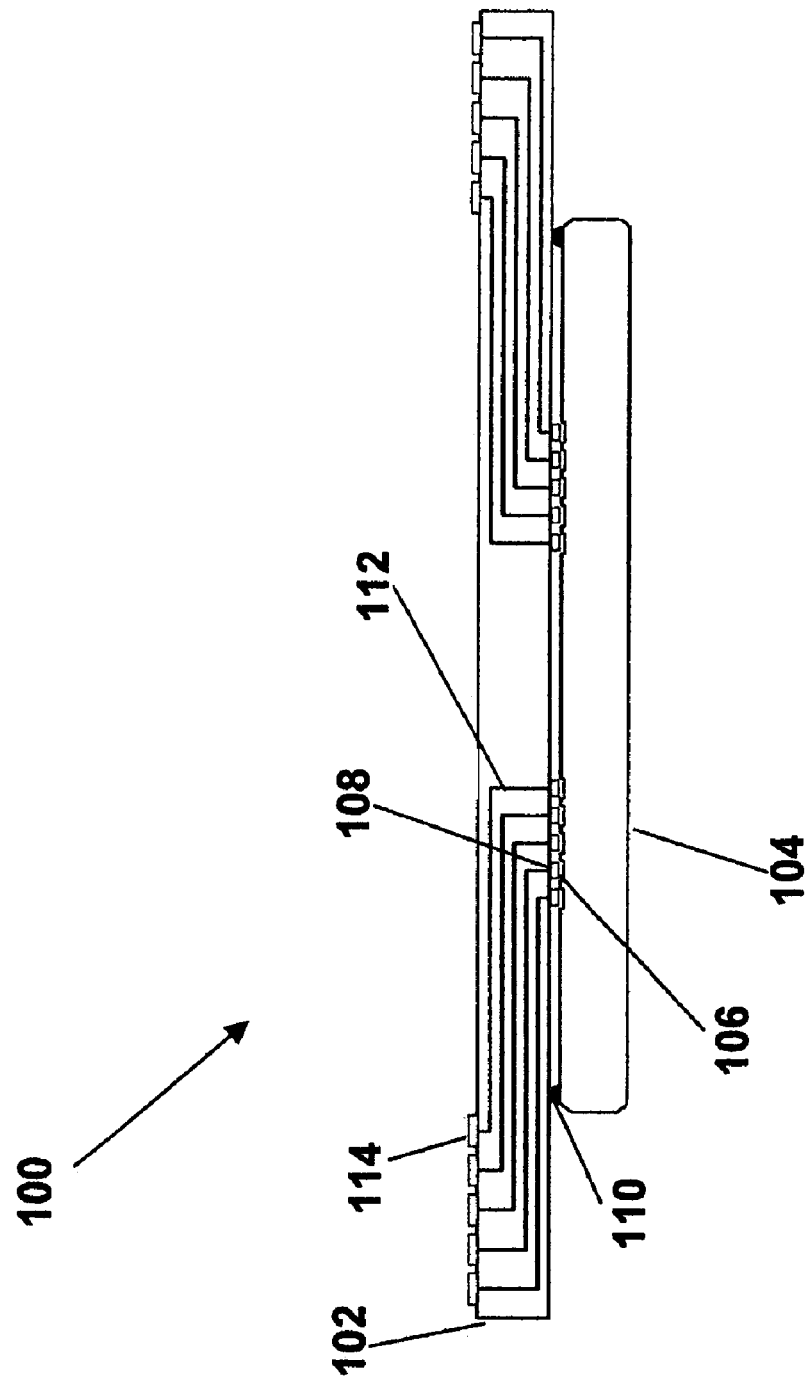
FIG. 1 is a schematic cross-sectional representation of a wafer and an edge-extended wafer translator in a removably attached state, with a gasket disposed between the wafer and the edge-extended wafer translator, forming an assembly having conductive pathways extending beyond the edges of the wafer, and coupled to conductive pads disposed on the inquiry-side the edge-extended wafer translator.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

Terminology

Reference herein to "circuit boards", unless otherwise noted, is intended to include any type of substrate upon which circuits may be placed. For example, such substrates may be rigid or flexible, ceramic, flex, epoxy, FR4, or any other suitable material.

Pad refers to a metallized region of the surface of an integrated circuit, which is used to form a physical connection terminal for communicating signals to and/or from the integrated circuit.

The expression "wafer translator" refers to an apparatus facilitating the connection of pads (sometimes referred to as terminals, I/O pads, contact pads, bond pads, bonding pads, chip pads, test pads, or similar formulations) of unsingulated integrated circuits, to other electrical components. It will be appreciated that "I/O pads" is a general term, and that the present invention is not limited with regard to whether a particular pad of an integrated circuit is part of an input, output, or input/output circuit. A wafer translator is typically disposed between a wafer and other electrical components, and/or electrical connection pathways. The wafer translator is typically removably attached to the wafer (alternatively the wafer is removably attached to the translator). The wafer translator includes a substrate having two major surfaces, each surface having terminals disposed thereon, and electrical pathways disposed through the substrate of the wafer translator to provide for electrical continuity between at least one terminal on a first surface and at least one terminal on a second surface. The wafer-side of the wafer translator has a pattern of terminals that matches the layout of at least a portion of the pads of the integrated circuits on the wafer. The wafer translator, when disposed between a wafer and other electrical components such as an inquiry system interface, makes electrical contact with one or more pads of a plurality of integrated circuits on the wafer, providing an electrical pathway therethrough to the other electrical components. The wafer translator is a structure that is used to achieve electrical connection between one or more electrical terminals that have been fabricated at a first scale, or dimension, and a corresponding set of electrical terminals that have been fabricated at a second scale, or dimension. The wafer translator provides an electrical bridge between the smallest features in one technology (e.g., pins of a probe card) and the largest features in another technology (e.g., bonding pads of an integrated circuit). For convenience, wafer translator is referred to simply as translator where there is no ambiguity as to its intended meaning. In some embodiments a flexible wafer translator offers compliance to the surface of a wafer mounted on a rigid support, while in other embodiments, a wafer offers compliance to a rigid wafer translator. The surface of the translator that is configured to face the wafer in operation is referred to as the wafer-side of the translator. The surface of the translator that is configured to face away from the wafer is referred to as the inquiry-side of the translator. An alternative expression for inquiry-side is tester-side.

The expression "edge-extended wafer translator" refers to an embodiment of a translator in which electrical pathways disposed in and/or on the translator lead from terminals, which in use contact the wafer under test, to at least electrical terminals disposed outside of a circumferential edge of a wafer aligned for connection with, or attached to the edge-extended translator. These electrical terminals disposed outside of a circumferential edge of an attached wafer may be disposed on the inquiry-side and/or the wafer-side of the edge-extended wafer translator.

The expression "translated wafer" refers to a wafer that has a wafer translator attached thereto, wherein a predetermined portion of, or all of, the contact pads of the integrated circuits on the wafer are in electrical contact with corresponding electrical connection means disposed on the wafer side of the translator. Typically, the wafer translator is removably attached to the wafer. Alternatively, it may be said that the wafer is removably attached to the wafer translator, or that the wafer/wafer translator pair are removably attached to each other. In a further alternative, it may be said that the wafer and wafer translator are disposed in an attached state, and the attached state may be further qualified by indicating whether the attached state is permanent or temporary. Removable attachment may be achieved, for example, by means of vacuum, or pressure differential, attachment.

The terms chip, integrated circuit, semiconductor device, and microelectronic device are sometimes used interchangeably in this field. The present invention relates to the manufacture and test of chips, integrated circuits, semiconductor devices and microelectronic devices as these terms are commonly understood in the field.

FIG. 1 is a schematic cross-sectional representation of an assembly 100 of an edge-extended wafer translator 102 and wafer 104. The illustrative edge-extended wafer translator of FIG. 1 is substantially planar. A plurality of electrically conductive pads 106 disposed on the top surface of wafer 104 are brought into contact with a corresponding plurality of electrically conductive pads 108 disposed on the wafer-side surface of edge-extended wafer translator 102. The wafer and edge-extended wafer translator are typically removably attached to each other by means of a vacuum, or pressure differential, formed between the wafer, edge-extended wafer translator, and a gasket 110. In this illustrative embodiment, a plurality of wire paths 112 disposed within edge-extended wafer translator 102 lead from conductive pads 108 to a plurality of conductive pads 114 disposed on the inquiry-side of edge-extended wafer translator 102. It is noted that alternative arrangements for removably attaching the wafer and edge-extended wafer translator are contemplated by the present invention.

Figure 2:
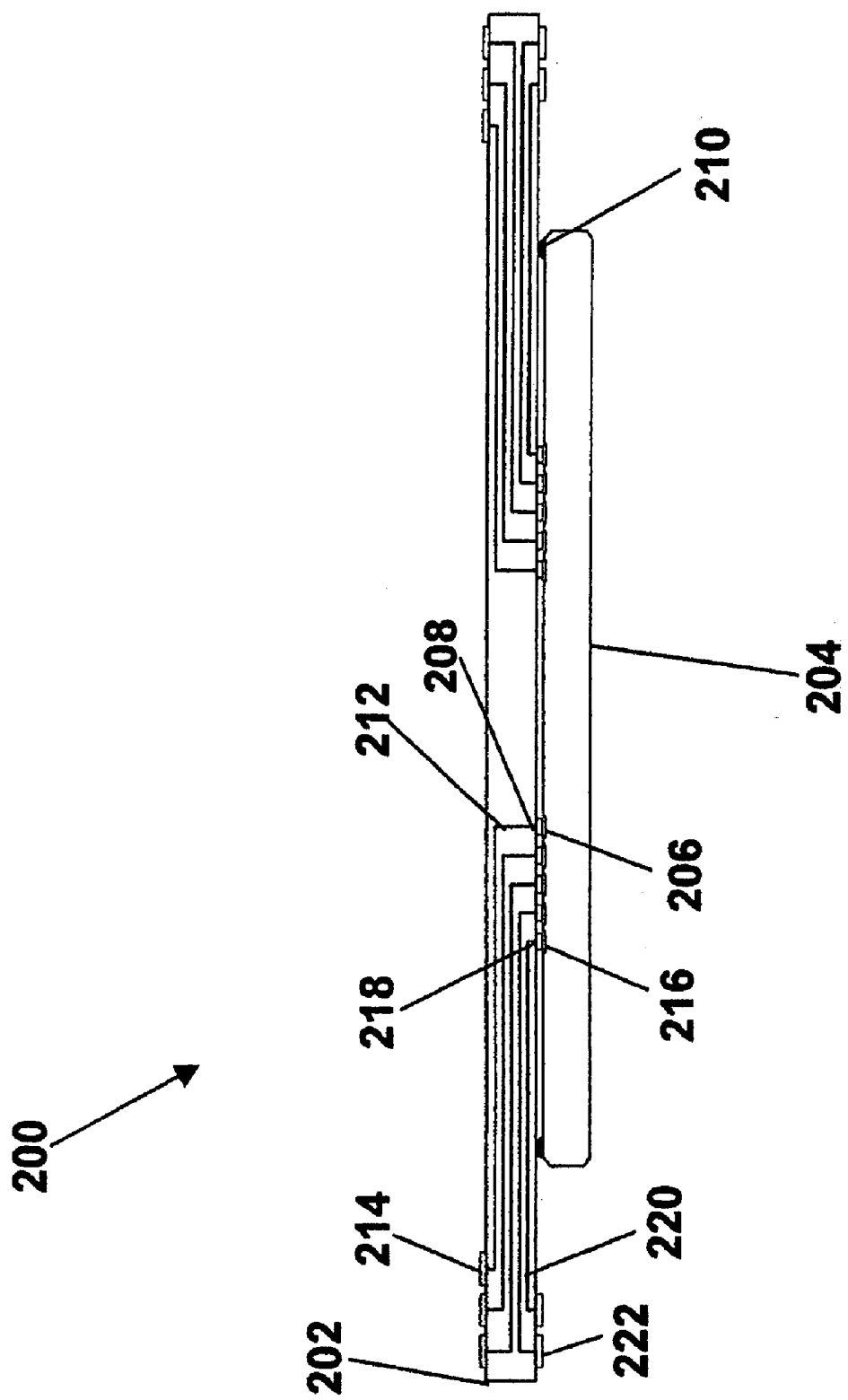
FIG. 2 is a schematic cross-sectional representation of a wafer and an edge-extended wafer translator in a removably attached state, with a gasket disposed between the wafer and the edge-extended wafer translator, forming an assembly having conductive pathways extending beyond the edges of the wafer, and coupled to conductive pads disposed on both the inquiry-side and the wafer-side of the edge-extended wafer translator.

FIG. 2 is a schematic cross-sectional representation of a planar edge-extended wafer translator 202 and a wafer 204 aligned for attachment to form assembly 200. It can be seen that edge-extended wafer translator 202 has two major surfaces, one which faces towards wafer 204 and is referred to as the wafer-side of edge-extended wafer translator 202; and one which faces away from wafer 204 and is referred to as the inquiry-side, or non-wafer-side, of the edge-extended wafer translator. Conductive pads 214 disposed on the inquiry-side are typically used to make connections with test equipment, but are not limited to such connections. Conductive pads 222 disposed on the wafer-side are also typically used to make connections with test equipment, but are not limited to such connections. It is noted that, since edge-extended wafer translator 202 extends beyond the edges of wafer 204, there is surface area of the wafer-side that is not covered by wafer 204, and therefore this area is available for pads and connections with other electronic devices and equipment. In the illustrated embodiment, an annular region of the wafer-side of edge-extended wafer translator 202, bounded by its outer circumference and the circumference of wafer 204, is available for conductive pads which may be coupled to other electrical nodes via wire paths disposed within and/or upon edge-extended wafer translator 202.

Still referring to FIG. 2, electrically conductive pads 214, 222 are disposed on both of the major surfaces of edge-extended wafer translator 202. A plurality of electrically conductive pads 206, 216 disposed on the top-side of wafer 204 are brought into contact with a corresponding plurality of electrically conductive pads 208, 218 disposed on the wafer-side surface of PE translator 202. Removable attachment of edge-extended wafer translator 202 and wafer 204 may be accomplished by means of vacuum, or pressure differential, between the atmosphere and the space bounded by edge-extended wafer translator 202, wafer 204, and a gasket 210. In this embodiment, a plurality of wire paths 212 disposed within edge-extended wafer translator 202 lead from conductive pads 208 to a plurality of conductive pads 214 disposed on the inquiry-side of edge-extended wafer translator 202. A plurality of wire paths 220, disposed within edge-extended wafer translator 202, lead from conductive pads 218 to a plurality of conductive pads 222 disposed on the portion of the wafer-side of edge-extended wafer translator 202 that is not covered by wafer 204.

Figure 3:
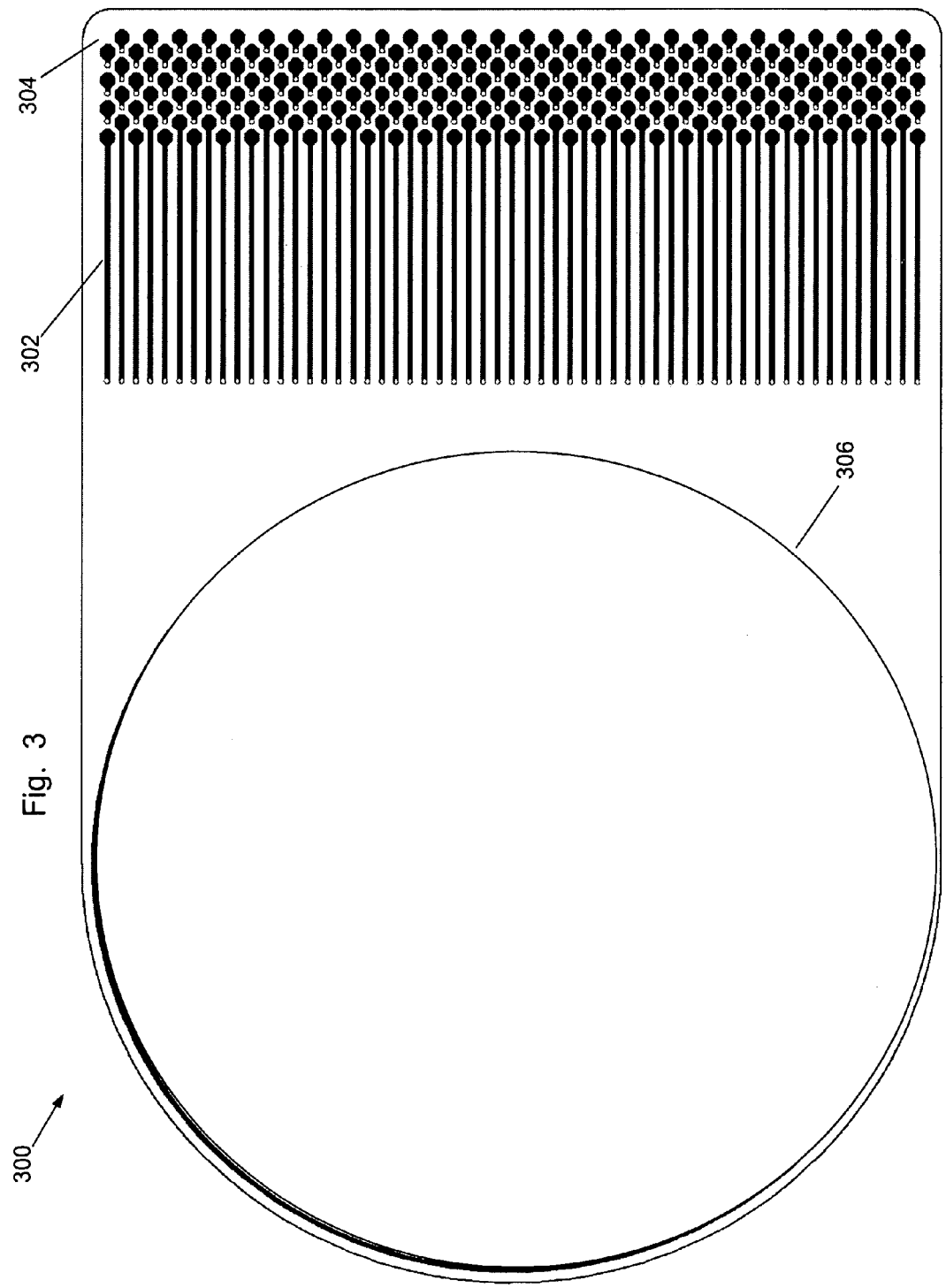
FIG. 3 is a top view of an edge-extended wafer translator wherein wire paths extend past from the circumferential edge of a wafer in one direction (perpendicular to a diameter of the wafer in the illustrated embodiment), to electrically conductive pads disposed on the inquiry-side of the edge-extended wafer translator.

FIG. 3 is a schematic top view of an embodiment of an edge-extended wafer translator 300 with a D-shaped form factor, wherein a plurality of conductive pathways 302 extend beyond the circumferential edge 306 of a wafer in a single direction (i.e., perpendicular to a diameter of the wafer contact area). The plurality of conductive pathways 302 contact a plurality of electrically conductive pads disposed on the inquiry-side of edge-extended wafer translator 300. It is noted that in alternative embodiments, conductive pathways may extend beyond the circumferential margin of a wafer in more than one direction, and that an edge-extended wafer translator may exhibit any form factor, such as, but not limited to, a circle, square or rectangle (as shown in FIG. 4).

Figure 4:
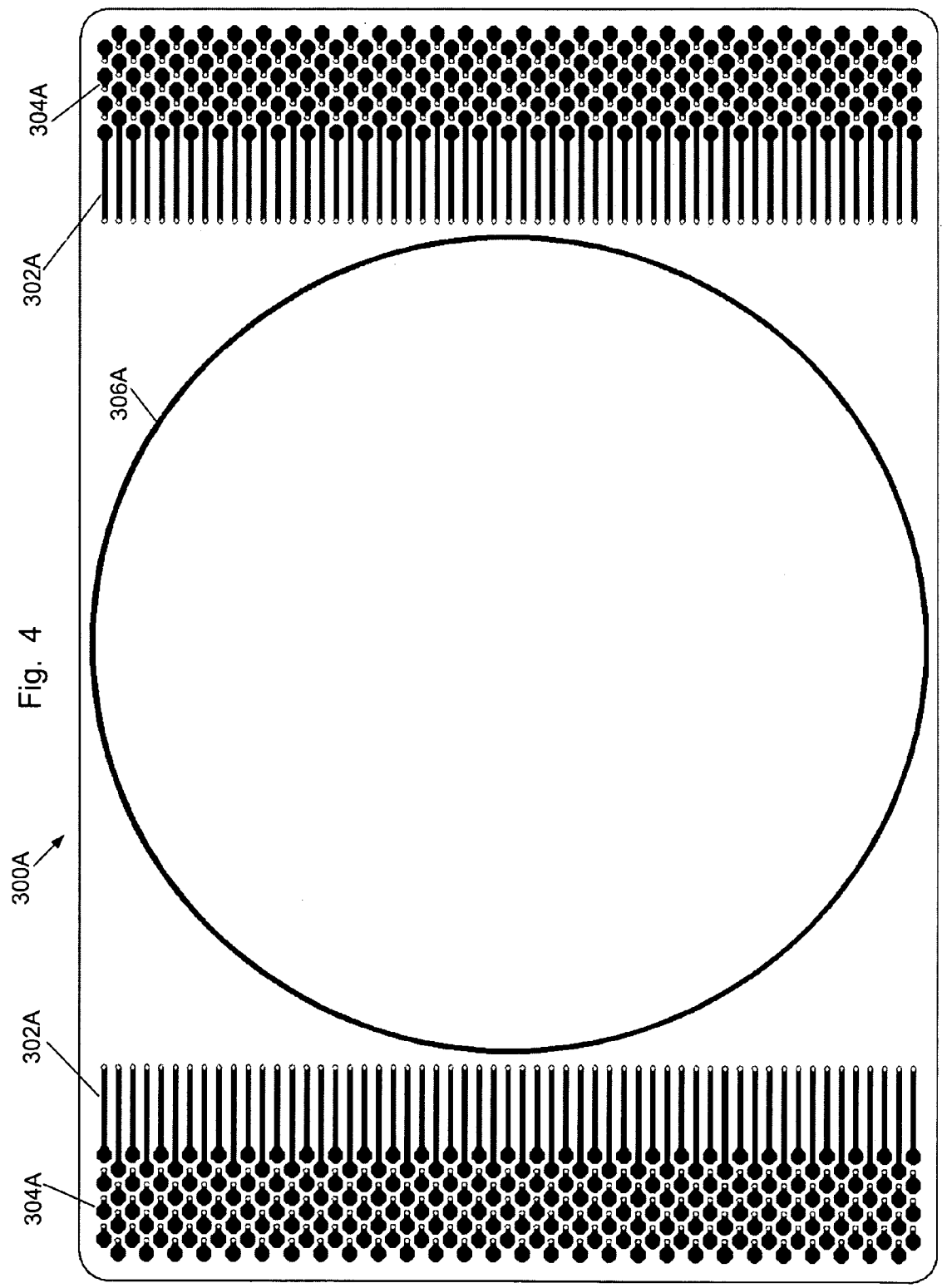
FIG. 4 is a top view of an edge-extended wafer translator wherein wire paths extend past the circumferential edge of a wafer in more than one direction.

FIG. 4 is a schematic top view of an alternative embodiment of an edge-extended wafer translator 300A with a rectangular form factor, wherein conductive pathways 302A extend beyond the circumferential margin 306A of a wafer in two directions, contacting a plurality of electrically conductive pads 304A disposed on the inquiry-side of edge-extended wafer translator 300A.

Figure 5:
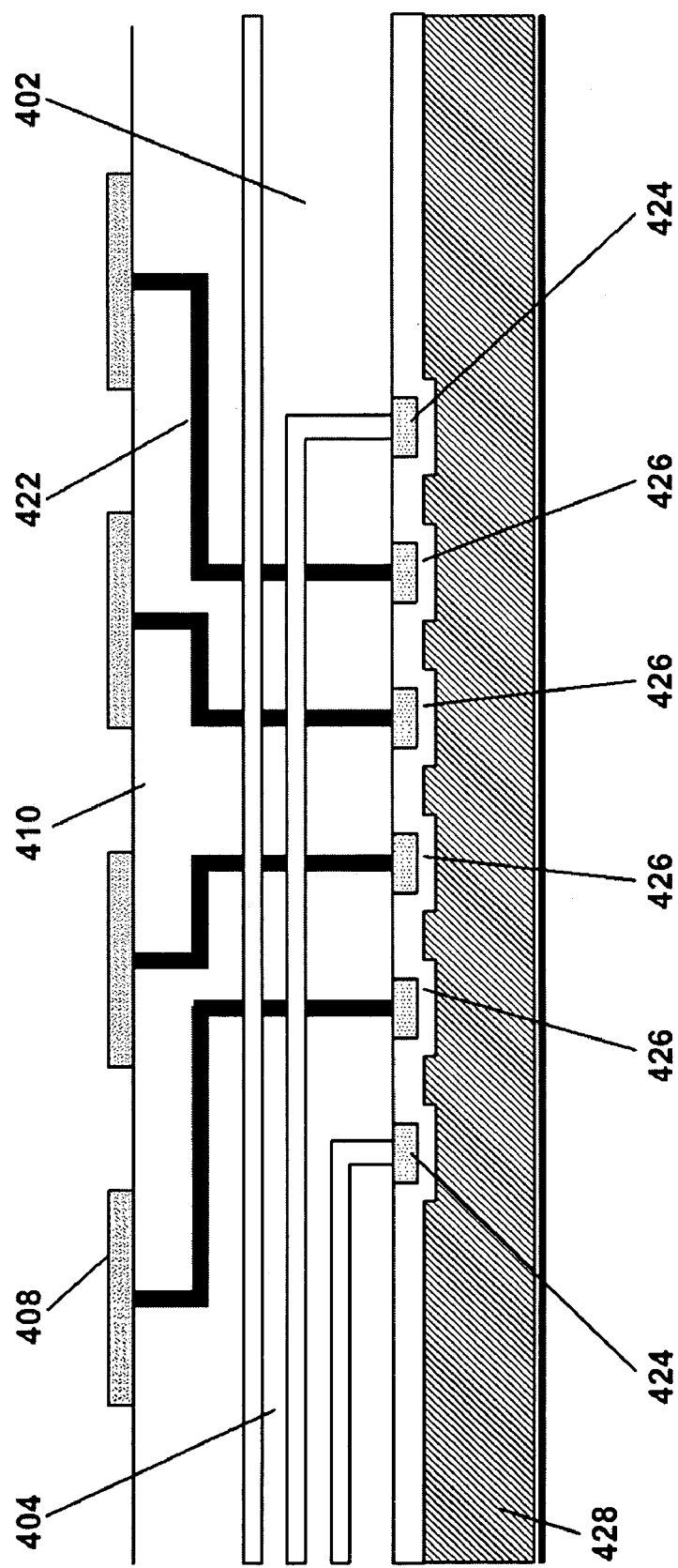
FIG. 5 is a cross-sectional view of a portion of a wafer and an edge-extended wafer translator wherein some wire paths of the edge-extended wafer translator lead away from the edge of a wafer, while other wire paths lead to pads disposed superjacent an area defined by the wafer.
Figure 6:
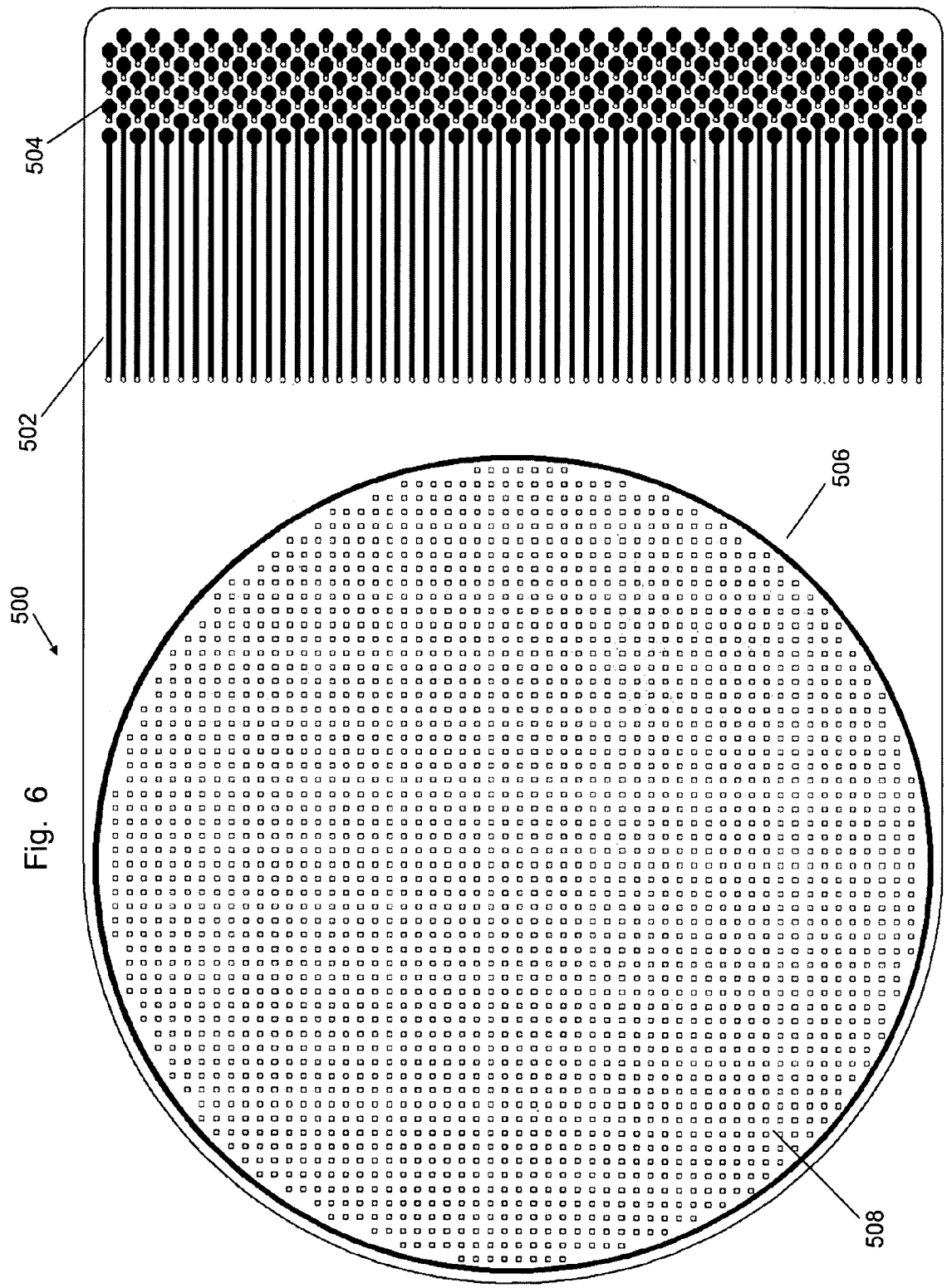
FIG. 6 is a top-view of an edge-extended wafer translator in which some wire paths extend beyond the edge of a wafer in a single direction, while other conductive pathways contact pads disposed within an area defined by the wafer.

FIG. 5 is a close-up, schematic cross-sectional view of an edge-extended wafer translator 402 in accordance with the present invention, wherein wire paths 404, 422 lead to electrically conductive pads disposed both within and without the circumferential margin of wafer 428. Wire paths 404 contact electrically conductive pads 424, disposed on the wafer-side of edge-extended wafer translator 402, and lead beyond the circumferential edge of wafer 428, to contact a plurality of electrically conductive pads disposed on the inquiry-side of edge-extended wafer translator 402, as shown in FIG. 6. Wire paths 422 contact electrically conductive pads 426 disposed on the wafer-side of edge-extended wafer translator 404, and lead to pads 408 disposed on the inquiry-side of edge-extended wafer translator 404 within the circumferential margin of wafer 420.

FIG. 6 is a schematic top view of an edge-extended wafer translator 500, in accordance with the present invention, wherein conductive pathways 502 extend beyond the circumferential edge 506 of a wafer, contacting a plurality of electrically conductive pads 504 disposed on the non-wafer-side of PE translator 500. Electrical paths (such as those depicted in FIG. 5) contact a plurality of electrically conductive pads 508 disposed on the non-wafer-side of PE translator 500 within the circumferential margin of the wafer. It is noted that in alternative embodiments, an edge-extended wafer translator with electrically conductive pads disposed both within and without the circumferential margin of a wafer may exhibit any form factor, such as, but not limited to, a circle, square, or rectangle.

An edge-extended wafer translator, as illustrated in FIGS. 1-6, provides an electrical interface between the translated wafer and a test system (not shown). Such a test system may provide power and signals to the device under test, and may further receive signals from the device under test. Such a system may alternatively serve to plug a wafer full of processors into a computer system; mesh routing may be facilitated by edge-extended wafer translators.

Apparatus in accordance with the present invention are suitable for providing electrical connections between a first set of pads on at least one die of a wafer and a corresponding second set of pads disposed on an insulating body removably attached to that wafer. More particularly, the insulating body has a form factor such that, when attached to the wafer, a portion of the insulating body extends beyond the area defined by the wafer. At least portions of the second set of pads may be disposed on portions of the wafer-side of the insulating body that are not covered by the attached wafer; may be disposed on portions of the inquiry-side of the insulating body that extend beyond the area defined by the wafer; may be disposed on portions of the non-wafer side of insulating body that are superjacent the wafer attachment area; and may be disposed in any combination of the foregoing.

An illustrative method of providing electrical access to one or more pads of one or more integrated circuits on a wafer, in accordance with the present invention, includes providing an edge-extended wafer translator having a wafer-side and an inquiry-side, a first plurality of contact terminals disposed on a first portion of the wafer-side, a second plurality of contact terminals disposed on a second portion of the wafer-side, a third plurality of contact terminals disposed on a first portion of the inquiry-side, and a fourth plurality of contact terminals disposed on a second portion the inquiry-side; aligning the wafer and the edge-extended wafer translator to each other; and removably attaching the aligned wafer and edge-extended wafer translator such that the first plurality of contact terminals are in electrical contact with the one or more pads of the one or more integrated circuits; wherein the second portion of the wafer-side is an area outside the region where the wafer is removably attached to the edge-extended wafer translator, and wherein the first plurality of contact terminals and the second plurality of contact terminals have different contact areas and different spacing therebetween.

CONCLUSION

The exemplary methods and apparatus illustrated and described herein find application in the field of integrated circuit test and analysis.

It is to be understood that the present invention is not limited to the embodiments described above, but encompasses any and all embodiments within the scope of the subjoined Claims and their equivalents.

What is claimed is:

1. A method of providing electrical access to one or more pads of one or more integrated circuits on a wafer, comprising:

providing an edge-extended wafer translator having a wafer-side and an inquiry-side, a first plurality of contact terminals disposed on a first portion of the wafer-side, a second plurality of contact terminals disposed on a second portion of the wafer-side, a third plurality of contact terminals disposed on a first portion of the inquiry-side, and a fourth plurality of contact terminals disposed on a second portion the inquiry-side;

aligning the wafer and the edge-extended wafer translator to each other; and removably attaching the aligned wafer and edge-extended wafer translator such that the first plurality of contact terminals are in electrical contact with the one or more pads of the one or more integrated circuits;

wherein the second portion of the wafer-side is an area outside the region where the wafer is removably attached to the edge-extended wafer translator, and wherein the first plurality of contact terminals and the second plurality of contact terminals have different contact areas and different spacing therebetween;

wherein removably attaching the wafer to the wafer-side of the edge-extended wafer translator comprises creating a pressure differential between a volume defined by the space between the wafer and edge-extended wafer translator, and the atmosphere outside the defined volume.

2. The method of claim 1, wherein each of the second plurality of contact terminals is electrically coupled to corresponding ones of the first plurality of contact terminals through wire paths internal to the edge-extended wafer translator.

3. The method of claim 2, wherein each of the third plurality of contact terminals is electrically coupled to corresponding ones of the first plurality of contact terminals through wire paths internal to the edge-extended wafer translator.

4. The method of claim 3, wherein each of the fourth plurality of contact terminals is electrically coupled to corresponding ones of the first plurality of contact terminals through wire paths internal to the edge-extended wafer translator.

5. The method of claim 1, wherein the edge-extended wafer translator is D-shaped.

6. The method of claim 1, further comprising disposing a gasket between the wafer and the edge-extended wafer translator.

7. A method of providing electrical access to one or more pads of one or more integrated circuits on a wafer, comprising:

providing an edge-extended wafer translator having a wafer-side and an inquiry-side, a first plurality of contact terminals disposed on a first portion of the wafer-side, a second plurality of contact terminals disposed on a second portion of the wafer-side, a third plurality of contact terminals disposed on a first portion of the inquiry-side, and a fourth plurality of contact terminals disposed on a second portion the inquiry-side;

aligning the wafer and the edge-extended wafer translator to each other; and removably attaching the aligned wafer and edge-extended wafer translator such that the first plurality of contact terminals are in electrical contact with the one or more pads of the one or more integrated circuits;

wherein the second portion of the wafer-side is an area outside the region where the wafer is removably attached to the edge-extended wafer translator, and wherein the first plurality of contact terminals and the second plurality of contact terminals have different contact areas and different spacing therebetween;

wherein the wafer is removably attached to the wafer-side of the edge-extended wafer translator by a pressure differential;

wherein a gasket is disposed between the wafer and the edge-extended wafer translator.

* * * * *